United States Patent
Anand et al.

(10) Patent No.: US 7,243,279 B2
(45) Date of Patent: Jul. 10, 2007

(54) METHOD FOR SEPARATING SHIFT AND SCAN PATHS ON SCAN-ONLY, SINGLE PORT LSSD LATCHES

(75) Inventors: Darren L. Anand, Essex Junction, VT (US); John E. Barth, Jr., Williston, VT (US); Steven F. Oakland, Colchester, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 10/604,908

(22) Filed: Aug. 26, 2003

(65) Prior Publication Data

US 2005/0050415 A1    Mar. 3, 2005

(51) Int. Cl.
   *G01R 31/28*    (2006.01)
(52) U.S. Cl. ...................................... 714/726
(58) Field of Classification Search ............... None
   See application file for complete search history.

(56) References Cited

U.S. PATENT DOCUMENTS 4,066,882 A * 1/1978 Esposito ...................... 714/724
6,639,848 B2 * 10/2003 Maejima ................ 365/189.07

OTHER PUBLICATIONS

Multiplexers (Wayback Machine Archive: http://www.cs.umd.edu/class/spring2003/cmsc311/Notes/Comb/mux.html , Published on Jul. 8, 2003).*

* cited by examiner

*Primary Examiner*—Guy Lamarre
*Assistant Examiner*—Steven D. Radosevich
(74) *Attorney, Agent, or Firm*—Michael J. Le Strange; Dillon & Yudell LLP

(57) ABSTRACT

A method and circuit design for enabling both shift path and scan path functionality with a single port LSSD latch designed for scan path functionality only, without increasing the device's internal real estate and without substantial increase in overall device real estate. The circuit design eliminates the need for additional logic components to be built into the internal circuitry of the device and also eliminates the cost of providing dual port LSSD latches within the device. Implementation of the invention involves providing a unique configuration of low level logic components as input circuitry that is coupled to a pair of single port LSSD latches that operate as the input latches for the device. The low level logic components accomplishes the splitting of scan chain inputs and shift chain inputs to the input latches and thus enables the single ported LSSD latches to operate with similar functionality as dual ported LSSD latches.

20 Claims, 4 Drawing Sheets

METHOD FOR SEPARATING SHIFT AND SCAN PATHS ON SCAN-ONLY, SINGLE PORT LSSD LATCHES

BACKGROUND OF INVENTION

1. Technical Field

The present invention relates generally to semiconductor devices and in particular to routing signals through serially connected circuits of semiconductor devices. Still more particularly the present invention relates to a method and circuit design for enabling both shift path and scan path functionality with a single port LSSD latch designed for scan path functionality only.

2. Description of the Related Art

Operation of semiconductor devices entails the passing of one or more input signals through a series of circuit components that are interconnected in a particular design configuration to generate a response (or output signal) within the device. The path through which the input signal propagates is determined by the type of connectivity among the various logic components within the device, and the value of the signal, as well as the accompanying clock signal.

To ensure proper operation of the semiconductor device, current design and fabrication procedures involves some amounts of post-fabrication testing on all or specific portions of the device to ensure that the components are functioning as desired and yield the correct (or expected) outputs at each stage of the device. For example, semiconductors and other similar devices manufactured with a large number of fuse elements are usually tested post-fabrication. Testing of the device may involve selectively blowing fuses within the device by passing an electrical current through the fuse link, depending on the design of the fuse/device. The fuses that are blown are selected via one or more programming methods, which are generally known to those skilled in the art.

The path utilized for post-fabrication testing is often times different from that utilized during normal signal propagation. In semi-conductor terminology, the normal routing path is referred to as the shift path (from the "shifting" of a propagating "1" or "0" signal in a serial manner from one component to another through the device), while the test path is referred to as the scan path.

Present designs provide a separate scan path along with the shift path for completing the testing of the device. The scan paths are utilized to verify the function of the logic and for any scan preconditioning of the latches done at test. The shift path is utilized for functional operation during fuse blow and fuse readout from the fuse sense latches.

FIG. 1 illustrates a prior art schematic of a portion of the input circuit for a device 100 comprising two levels of serially connected latches. For simplicity of description, the upper level (or register) latch and lower level latch are referred to herein as a latch pair. Also, the first pair of latches, are referred to as the input latches and the second (and subsequent) pair of latches, labeled "Repeatable Scan Latch," are referred to as internal device latches. Only two pairs of sequential latch pairs are illustrated; However, a complete device may comprise a much larger number of sequentially connected latch pairs similar to the second pair of latches.

As labeled in FIG. 1, the first pair of latches 102A, 102B are full LSSD latches and have dual input ports for both shift and scan chain operations. The second pair of latches, 112A, 112B, however, are scan only latches and thus accommodate only one (scan) path at a time. The two chains of latches (fuse latches 103 and pattern latches 113) are connected in serial fashion, with each latch receiving it's shift input from the previous latch and sending it's shift output to the next latch in the chain.

On the standard full LSSD latch 102A, 102B, two clock ports and two data input ports are provided. One port is used for functional operation (serial shifting in this case) and the other is used for scan operations, a test requirement. Each serial register of latches (LSSD scan latches) comprises a dual-phase latch. The first phase in an LSSD scan latch is called the L1 and is loaded with clock signal ACLK 114. The second phase in the LSSD scan latch is called the L2 and is loaded with signal BCLK 118.

Each latch is configured with an L1 and an L2. Both ports load the L1 of the latch. Only one port may be utilized at a time. The input signals include SCANIN0 104, SHIFTIN 106, SCANIN1 108, and SHIFT 120. Clock signals include CCLK signal 116, ACLK signal 114, and BCLK signal 118. A set of logic gates, AND gate 103 and OR gate 105 are provided to select when the shift input 120 would be allowed to load the L1 during operation.

According to FIG. 1, both the upper level and lower level latches are full LSSD (level sensitive scan design) dual port latches designed to enable separate scan and shift paths as illustrated. A first scan pattern, SCANIN0, is loaded into the upper latch, while a second scan pattern, SCANIN1, is loaded into the lower latch. From the perspective of a scan path, particular types of latches are provided to enable a scan chain evaluation for the device. The upper latch receives a SHIFTIN signal, which triggers the beginning of a shift path. Three clock inputs are also provided to transition the scan and/or shift signal along the device. Each path includes separate clocking domain. The shift/scan path are separated by providing separate shift clock (CCLK) and scan clock (ACLK) signal.

With designs where the functional path matches the scan path, it is possible to use a single data port latch along with OR logic and OR the shift clock (CCLK) and scan clock (ACLK) signals together. However, it may also be required that a long shift path be separated into multiple scan paths. At locations where splitting of the paths is desired, typically a full LSSD latch would be inserted between scan only LSSD latch pairs to provide separate shift and scan ports to the L1.

Particular types of devices, such as electrical fuse (eFuse) devices, for example, are typically designed with separate scan and shift paths, from the perspective of the latch circuitry. In eFuse circuit terminology, the upper level latch 102A is referred to as the fuse sense latch (or fuse latch) and is utilized to read the state of the fuse. Upper level latch is also utilized during the fusing process to enable/disable the blowing of the associated fuse. The lower level latch is referred to as the pattern latch and is utilized to store the redundancy solution calculated for the device. The upper (fuse) latches 103 and lower (pattern) latches 113 are serially connected and may be wired into additional circuitry (e.g., fuse and transistor) in the device.

According to the current art, and as illustrated by FIG. 1, the shift and scan paths were normally split with the addition of a full LSSD latch where the paths had to be split. This addition of a full LSSD latch at each split is difficult to manage in a hierarchical design where the first latch has to be nested completely differently from subsequent latches.

In a next implementation, the shift and scan paths are combined on a scan-only latch by logically ORing the shift clock (CCLK) and scan clock (ACLK) to the latches. This can be done wherever the scan path and functional path share the same serial path through the latches. Removal of the above mentioned requirement was critical for the eFuse design since the electrical design of all the fuse sense latches needed to be the same with the same layout for matching purposes. It was also difficult to do the physical design on a tight pitch with a different latch up front.

One primary concern with current designs is the additional area overhead required because of the need to provide OR gates and other logic within the device for each scan path when a single port latch configuration is utilized. With the dual port LSSD latch configuration, the concern involves additional cost as well as real estate in providing the larger dual port LSSD latches rather than the single port LSSD latches. The current method of providing both scan path and shift path operations for a device also presents problems with embedding particular types of circuitry within an ASIC design. LSSD methodology issues have to be solved to allow for all fuse latches to exist on a single shift register but be broken into multiple scan chains or scan paths. This requires "splitting" the scan and shift paths where required to facilitate ASIC design and test methodology. Using scan only latches and full LSSD latches in the fuse latch chain creates a problem because the electrical characteristic of the internal sense node for fuse are not the same in the two different latch designs, and still requires additional real estate within/on the device.

The present invention recognizes the above inefficiencies that exist in the current design and testing of devices that require both scan path and shift path operations. The invention further recognizes that a method and device that enables efficient combination of scan path and shift path functionality in a single port latch without incurring additional internal overhead costs would be a welcomed improvement. Also desirable is a method and device that enables reduced area overhead along within the device's internal circuitry. These and other benefits are provided by the invention described below.

SUMMARY OF INVENTION

Disclosed is a method and circuit design for enabling both shift path and scan path functionality with a single port LSSD latch designed for shift path functionality only, without increasing the device's internal real estate and without substantial increase in overall device real estate. The circuit design eliminates the need for additional logic components to be built into the internal circuitry of the device and also eliminates the cost of providing dual port LSSD latches within the device. Implementation of the invention involves providing a unique configuration of low level logic components as input circuitry that is coupled to a pair of single port LSSD latches that operate as the input latches for the device. The low level logic components accomplish the splitting of scan chain inputs and shift chain inputs to the input latches and thus enables the single ported LSSD latches to operate with similar functionality as dual ported LSSD latches.

The device is designed with a standard set of serially connected single-input scan-only latches (and other functional circuitry). The input circuitry comprises a set of NAND gates, OR gates, and non-inverting buffers that are interconnected according to the design configuration of the invention. Outputs of several of the input circuitry along with several clock inputs serve as the inputs for the single port LSSD latches. The net effect of the input circuitry is that received scan and shift inputs along with clock signal inputs are filtered to provide shift input or scan input to the latch so that the latch may be utilized for both scan chain functionality and shift chain functionality. The specific inter-connection of gates with the clock inputs enable the separation of scan chain features and shift chain features as inputs to the input latches. With this separation of inputs, the single-input scan only latch is able to provide the functionality required for both scan chain operation and shift chain operation.

In one embodiment, an eFuse device is designed with a traditional scan-only (single clock/data port) LSSD latch, which is coupled to input logic components to enable similar functionality as a full LSSD latch (dual clock/data port) with the addition of some circuitry to the inputs of the first latch of the device. The additional circuitry is thus external to the internal sense node of the latches and there are no additional logic required within the paths. The LSSD scan chain is then enabled in addition to the functional shift register along the same path.

The above as well as additional objectives, features, and advantages of the present invention will become apparent in the following detailed written description.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The present invention provides a novel method and design that enables the utilization of a single port LSSD latch to efficiently provide both a shift path and a scan path and associated features with reduced area overhead for the device's internal area. The invention provides a novel circuit design to overcome the problems of: (1) requiring larger device area for supporting a multiple, separate latches for shift path and scan path within a single device; or (2) requiring additional logic (OR) within the paths of the device to enable scan chain functionality.

More specifically, the invention allows a scan-only latch operating as single clock/data port to be utilized as a full LSSD latch (i.e., one with dual clock/data port) with the addition of circuit elements to the inputs of the initial single-ported, scan only LSSD latch. Thus, the only addition to the device real estate is with external logic utilized to separate the scan path from the shift path with scan only latches.

The external logic are low-level inexpensive and relatively area-efficient components. Also, the input circuit elements are external to the internal sense node of the latch, and the device does not require additional internal real estate. Additionally, because the circuit elements allow both shift path and scan path features and are external to the serially connected latches, significant savings in real estate are recognized. For example, the OR logic and other additional logic required per circuit to complete the two different operations within each circuit are no longer required.

Figure 1:
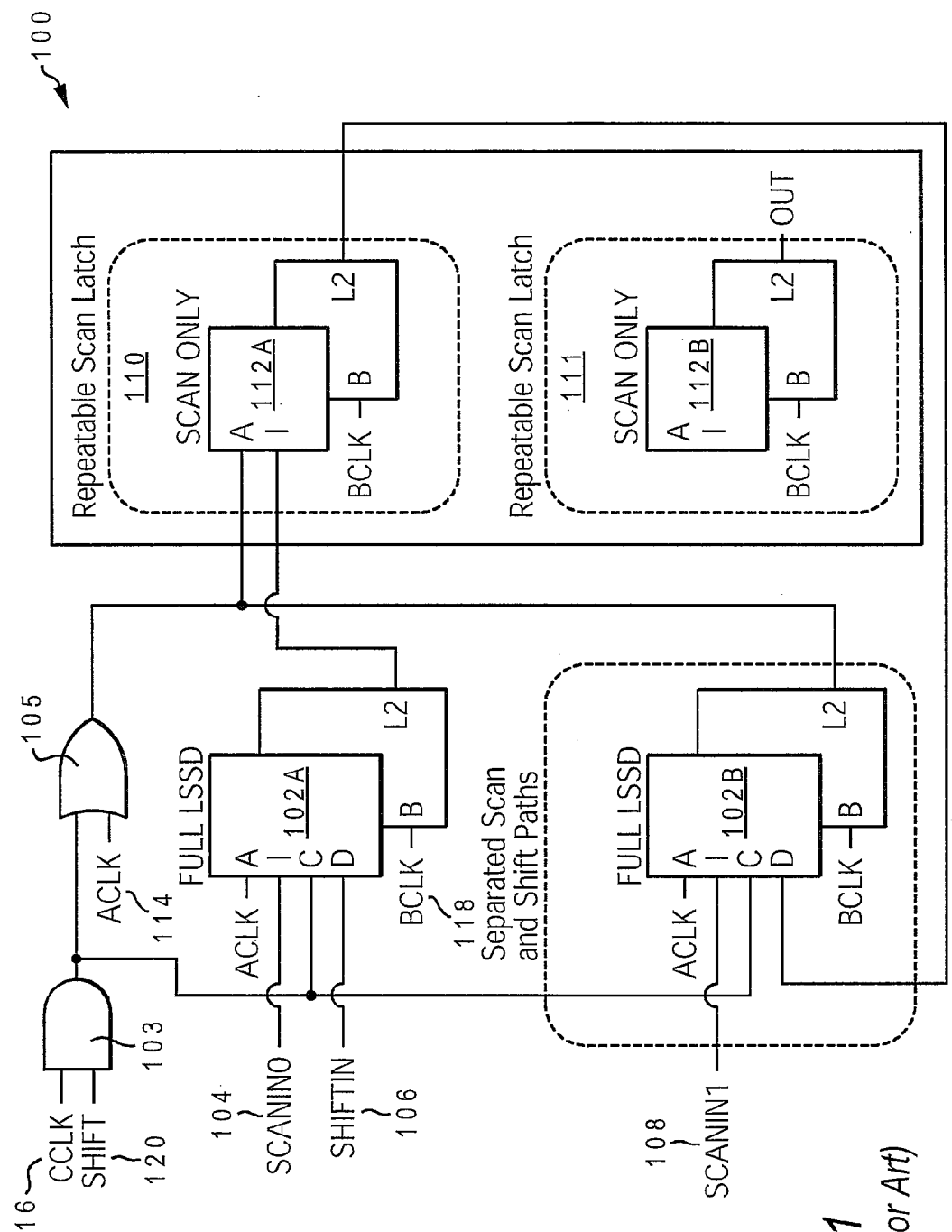
FIG. 1 is a schematic diagram of a prior art fuse latch circuit configuration with dual port full LSSD latches and additional logic for providing separate scan and shift paths.
Figure 2:
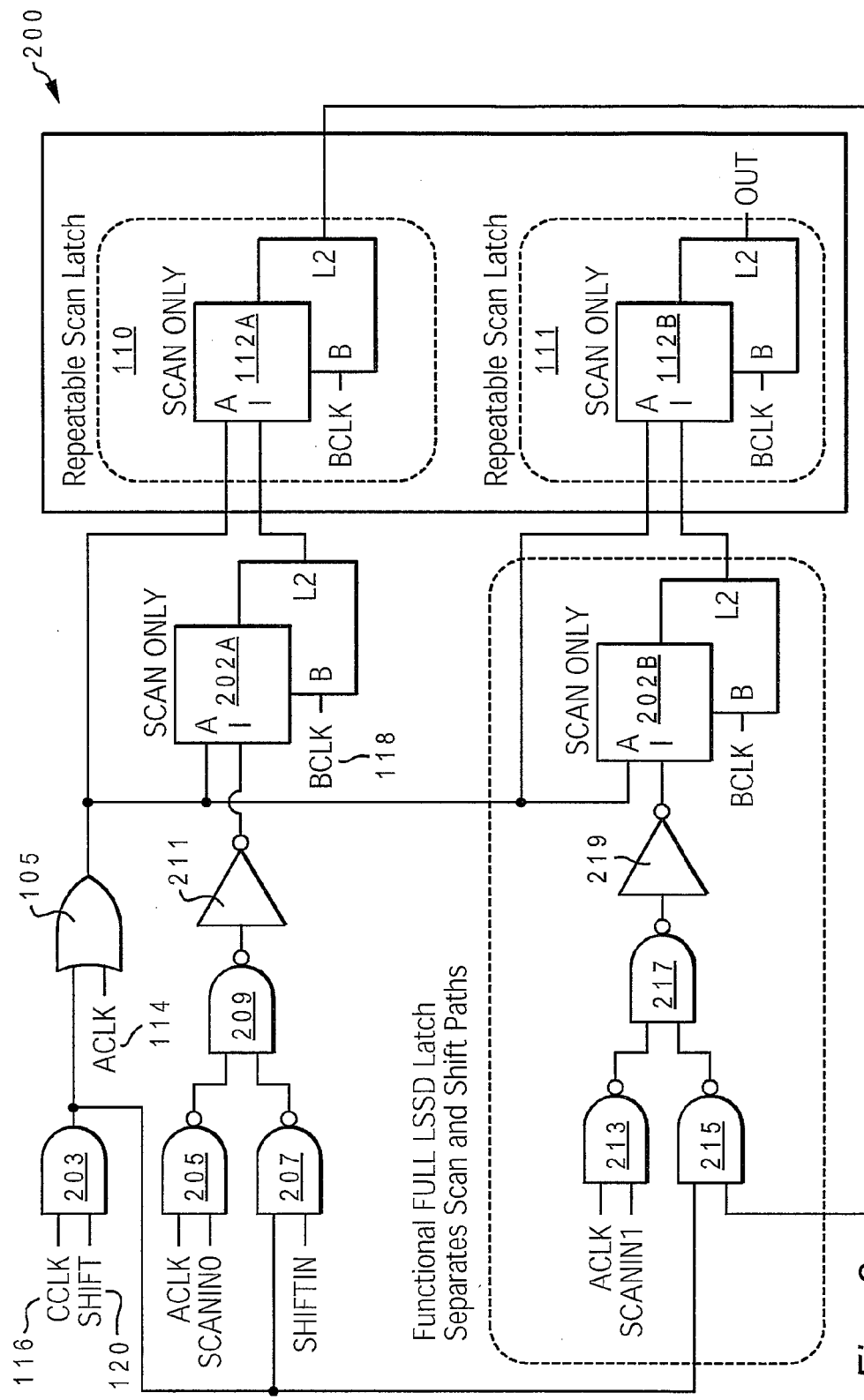
FIG. 2 is a schematic diagram of input circuitry of a device having a single port LSSD latch that enables both a shift path and scan path via the single port LSSD latch without incurring significant area overhead within the device in accordance with one embodiment of the present invention.

The invention is described with primary reference to the circuit schematic of FIG. 2; However, those skilled in the art appreciate that the features of the invention may be extended to other circuit configurations that are designed to utilize both scan chain and shift chain path methodology. The primary visible difference in the device configuration with that of FIG. 1 is with the input circuitry and the type of latch being utilized. Specifically, the dual input latch has been replaced with a single input latch and the input circuitry has been extended to enable separation of scan chain and shift chain inputs without requiring separate latches or dual input latches. During scan chain operation the smaller scan only latches are utilized at each stage of the device rather than the larger dual port LSSD latches or separate latches as utilized in previous designs. Also the alternate operation in which additional OR and other logic are provided at each stage of the device's internal circuitry to accommodate the dual path (specifically scan chain) operations is eliminated.

Referring now to FIG. 2, there is illustrated a schematic circuit diagram of a semiconductor device designed according to the methods of the present invention. Specifically, FIG. 2 shows the new configuration for a latch controlled device that requires separation of scan and shift paths within the device operations using a single port latch. Thus, FIG. 2 illustrates a modification of the semiconductor device that enables a single input LSSD latch to be utilized to provide the functionality of a dual input LSSD latch supporting both shift path and scan path operation according to one embodiment. This configuration of input circuitry solves the problem of breaking the single shift path into multiple scan paths without requiring significant additional logic within the device itself.

Device 200 comprises two levels of input LSSD latches, upper level latch 202A and lower level latch 202B as well as repeatable internal latches 112A and 112B (see box labeled "Repeatable scan latch"). At each level, the latches are serially connected and receive inputs from a previous latch in the sequence of latches. Each latch-control circuit 110, 111 comprises a scan-only LSSD latch 112A, 112B.

According to the illustrated embodiment, logic devices are added to fuse latch inputs where a new scan path is required in order to keep all fuse latches identical. Logic devices include an AND gate 203, several 2-input NAND gates 205, 207, 209, 213, 215, 217 and non-inverting buffers 211, 219. For both the upper and lower levels of input latch 202A, 202B, two NAND gates (e.g., 205, 207) receive shift and scan inputs and clock signal inputs and yield respective outputs that are coupled to the inputs of a third NAND gate 209. The output of the third NAND gate 209 is passed through a non-inverting buffer 211 and then on to input latch 202A. Non-inverting buffer 211 is utilized to delay the gating of the data when the ACLK or CCLK clock that is "on" shuts off. This ensures that the clock at the latch 202A is off before the data is removed (i.e., providing a data hold time). The connection of the various devices in the configuration shown provides a MUX-like function where the clock that loads the data into the latch also gates the data.

With continuing reference to FIG. 2, when the clock signal ACLK 114 is high, the scan input (SCANIN0) is passed to the latch scan input port (I). If the clock signal CCLK 116 is high, the shift input (SHIFTIN) is passed to the latch input. The clock input of the input latch is provided by ORing of the CCLK signal 116 and the ACLK signal 114 by OR logic 105. CCLK signal 116 is also gated by an additional input on AND gate 203, referred to as SHIFT 120. SHIFT 120 is asserted when a shifting operation in the fuse latches is required.

The pattern latches 202B also utilize an identical method to break the pattern shift chain into multiple scan chains. Non-inverting buffer 219 is utilized to delay the gating of the data when the ACLK or CCLK clock that is "on" shuts off. This ensures that the clock at the latch 202B is off before the data is removed (i.e., providing a data hold time). Careful circuit analysis and tuning is required to ensure that the latch hold time requirement is met. The clocks are thus utilized as MUX selects since the ACLK and CCLK are not "on" at the same time. The timing of the circuits makes sure the clock that is on shuts off before the data is forced to "0" (i.e., the door to the latch 202B is closed before the ACLK clock goes to 0.)

Figure 3:
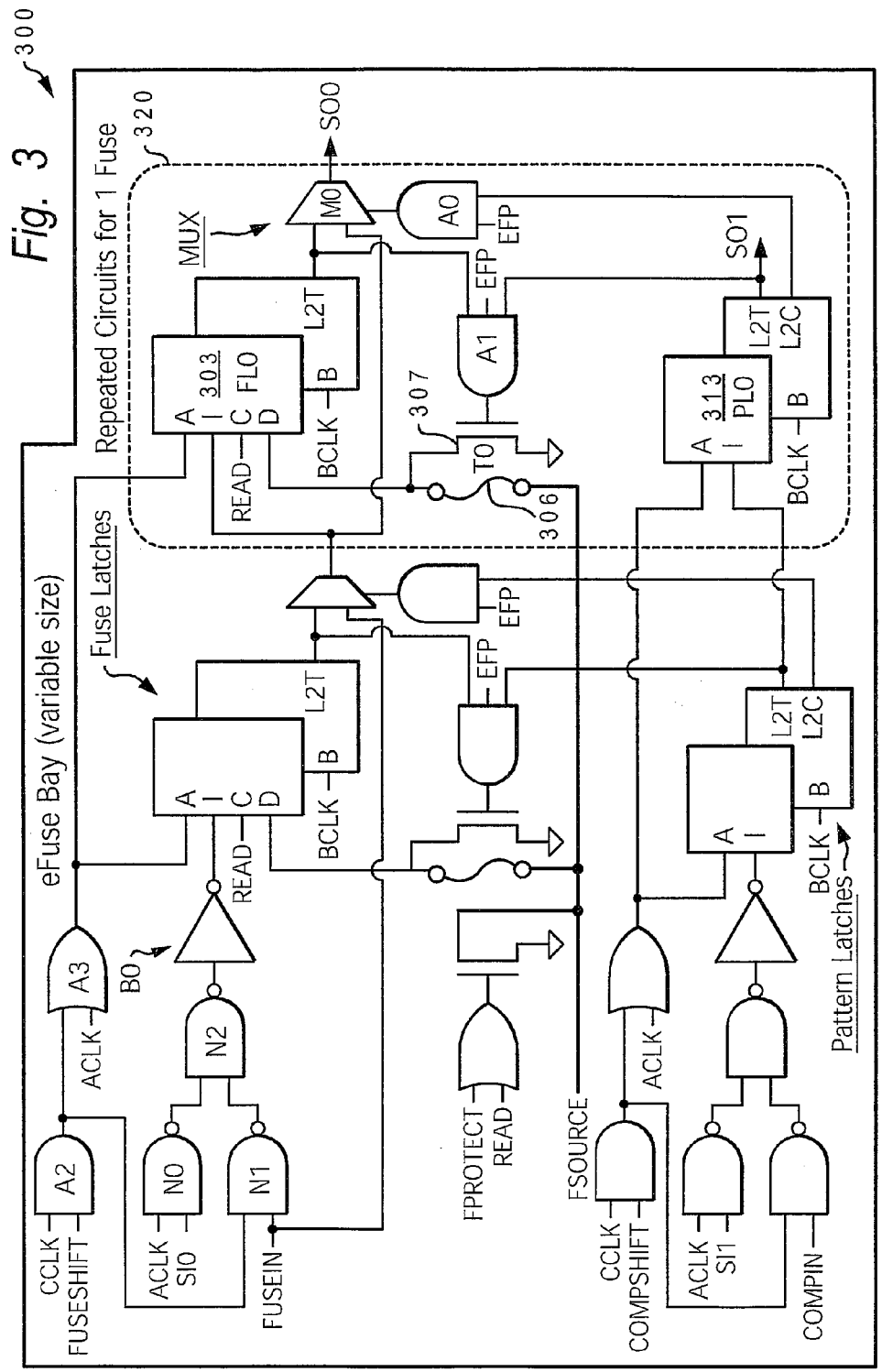
FIG. 3 is a schematic diagram of an electrical fuse (eFuse) device designed with the input circuitry of FIG. 2 to enable separation of shift chain and scan chain operation via a single port LSSD latch in accordance with one implementation of the present invention.

One device within which the features of the invention may advantageously be applied is within an eFuse device with multiple serially connected latch controlled eFuse circuits, which may be designed according to the novel design described in co-pending U.S. patent application, serial number (Attorney Docket Number BUR920020093US1), titled "METHOD FOR REDUCED ELECTRICAL FUSING TIME" and filed on June XX, 2003. FIG. 3 illustrates a sample eFuse circuit designed according to that application with the input latch configuration similar to that of the current invention. As described within that related application, eFuse circuit 320 comprises fuse sense latch or fuse latch (FL0) 303, utilized to read the state of the fuse and during the fusing process to enable the fuse that is currently being blown. Also, each eFuse circuit 320 comprises pattern latch (PL0) 313, utilized to store the fuse solution previously calculated and programmed for the device. In addition to the scan only latches, each eFuse circuit 320 comprises an eFuse 306, which may be blown when current signals are provided to a source and gate of transistor 307. Input circuitry of eFuse circuit 320 is configured somewhat similarly to that of FIG. 2, except that the various inputs lead to a primary (or first) fuse circuit and these somewhat different inputs control and program the eFuse circuit to enable the functionality for which the circuit is designed.

Figure 4:
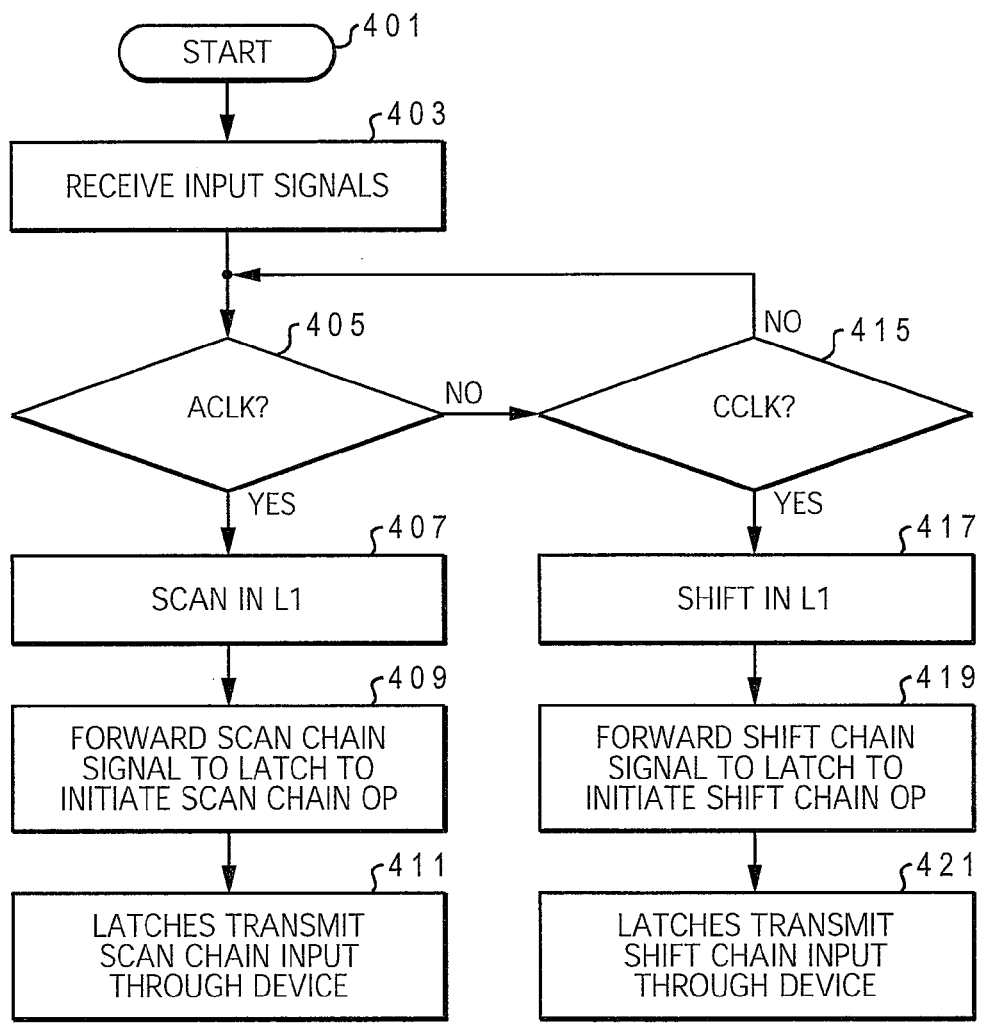
FIG. 4 is a basic flow diagram illustrating the process by which particular input signals are separated for scan path propagation versus shift path propagation in the device of FIG. 2 according to one implementation of the invention.

FIG. 4 provides a logic flow diagram of the processing of a scan chain and/or shift input signal by the semiconductor device of FIG. 2. The process begins at block 401 and proceeds to block 403 with the device receiving input data signals (i.e., signals at the NAND gates) along with a clock signal. If, as determined at block 405, the clock signal received is the clock A signal (ACLK) signal (which indicates that a scan path is being started) then the scan chain input is forwarded to the input latch (L1) as shown at block 407 and a scan chain operation is initiated as shown at block 409. The latches of the device then transmit the scan chain input through the device as shown at block 411.

Returning to decision block 405, when the ACLK input clock signal is not being asserted, the C clock (CCLK) signal is received at the device's input as shown at block 415. The shift chain input is then accepted at the input latch (L1) as indicated at block 417. In the illustrative embodiment, the CCLK signal must be high in order for a shift path operation to proceed. When the clock C signal is high and the shift chain input is forwarded to the input latch, a shift chain operation is initiated as indicated at block 419. The latch then transmits the shift chain input through the device as shown at block 421.

It should be understood that the actual logic evaluations completed by the input circuitry occur by NANDing and ORing particular inputs that are likely represented as a 1 or 0. A high clock signal thus represents a clock signal with a value of 1 rather than 0 and the receipt of an input signal may be a receipt of a high (or 1) value on the input lines running into the input logic component.

Those skilled in the art will appreciate that this method of breaking the LSSD scan chain from the functional shift register path will be very useful inside many hard designs. One example of the utility is within compilable arrays with shared scan/shift path latches where the layout of the latch is in a compilable kernel, and the same kernel is utilized for all data bits. With the addition of this external logic, any scan only latch can be converted to function as a full LSSD latch without changes to the scan only latch itself. This can prove very useful in hierarchical designs where the function of a latch is determined based on it's nesting in the data. In these cases, the logic to separate a scan and shift path can be added as needed. Also, according to the invention, a better scan chain testing design is also provided.

The invention allows the splitting of scan chains and shift chains with no additional overhead within the device. The invention provides a significant benefit with respect to device area overhead. The invention replaces the traditional separate shift register and scan path via single purpose eFuse sense latch. The invention determines which level sensitive clock was on to determine which path (shift or scan) should be passed into the latch. The invention finds applicability to eFuse and eDRAM design and other cores for application specific integrated circuits (ASIC) as well.

The techniques of the present invention find applicability to the design of other devices besides the eFuse device. For example, the invention may be utilized with ASIC design in Cu08 (CMOS9SF), with eDRAM designs and other cores. The invention may also be utilized for tapping into the LSSD scan chain for functional shifting purposes by sharing the scan port in BIST designs for embedded compilable SRAMs and CAMs. The invention provides great assistance with physical designs where custom, on pitch circuitry is being utilized particularly because adding logic to the front of these custom latches is much simpler than inserting different latch types. In the true sense of the LSSD latch, the invention does not replace the LSSD latch but merely provides the functionality that would have been provided by an LSSD latch without requiring the additional LSSD hardware within the device itself. Further, from a technical standpoint the invention allows for providing the function by design (custom design) and modeling the circuit as a full LSSD latch.

While the invention has been particularly shown and described with reference to a preferred embodiment, it will be understood by those skilled in the art that various changes in form and detail may be made therein without departing from the spirit and scope of the invention.

The invention claimed is:

1. An input circuit for providing separate scan and shift paths for a device utilizing single data input latches, said circuit comprising:
    a first latch having a single data input port and a single clock input port and an output port;
    a second latch also having a single data input port and a single clock input port and an output port;
    means for receiving a first clock input signal that enables selection of a scan chain input to said first latch and said second latch;
    means for receiving a second clock input signal that enables selection of a shift chain input to said first latch and said second latch; and
    wherein a selection of the scan chain input for passing to said input ports of said latches occurs exclusive of selection of the shift chain input for passing to said input ports, and vice versa, and wherein said single data input latches provide functionality of latches that support multiple inputs.

2. The input circuit of claim 1, further comprising:
    means for receiving said scan chain input; and
    means for receiving said shift chain input.

3. The input circuit of claim 1, further comprising:
    means for receiving a data signal at the data input port of each of said latches, wherein said data signal is one of a scan chain input or a shift chain input;
    means for accepting the scan chain input into said latches to commence a scan chain operation within said device when the first clock input signal is on; and
    means for accepting the shift chain input into said latches to commence a shift chain operation within said device when the second, different clock input signal is on, wherein only one of the first clock input signal and the second, different clock input signal is on at a time and both said scan chain operation and said shift chain operation are supported by said single data input latches.

4. The input circuit of claim 3, wherein:
    said means for accepting the scan chain input includes a first NAND gate that receives as inputs a first clock signal along with a scan chain input and yields a scan chain NAND output;
    said means for accepting the shift chain input includes a second NAND gate that receives as inputs a second clock signal along with a shift chain input and yields a shift chain NAND output, wherein both said first and second NAND gates process inputs during an input operation; and
    a third NAND gate that receives as input said scan chain NAND output and said shift chain NAND output, wherein both outputs are subsequently NANDed to yield a two-tiered NAND result.

5. The input circuit of claim 4, further comprising a non-inverting buffer that temporarily delays the two-tiered NAND result prior to forwarding said two-tiered NAND result to the first and second latches as their input, wherein said NAND result is delayed for a pre-set period of time during which a respective clock input signal is on.

6. The input circuit of claim 1, wherein said second clock input is ANDed with a shift input to yield a shifted second clock input that is utilized as the second clock input for selection of said shift chain input.

7. The input circuit of claim 1, further comprising an OR gate having inputs of said first clock input signal and a result of an ANDing of said second clock input signal with a shift input, wherein an output of an OR gate is utilized as the clock input of the first and second latches.

8. The input circuit of claim 1, wherein said first clock input signal and said second clock input signal each provide a select signal for respectively receiving either said scan chain input or said shift chain input into said latches, wherein further, the selected input triggers a respective scan chain or shift chain operation to be completed through the device.

9. The input circuit of claim 1, wherein said latches are scan-only LSSD latches.

10. The input circuit of claim 1, wherein said device is a semiconductor device and said input circuit is fabricated on said semiconductor device.

11. The input circuit of claim 10, wherein said semiconductor device is an eFuse device.

12. In a device that includes multiple electrical fuse (eFuse) circuits that are serially connected, a circuit for programming and testing electrical fuses, said circuit comprising:
an input circuit that enables a scan only latch to be utilized to dynamically select from among a scan chain path and a shift chain path being inputted to said device utilizing a series of input clock signals operating as MUX selects for the scan only latch to select either said scan chain path or said shift chain path for passing through said device;
serially connected eFuse circuit comprising:
AND logic having two inputs and an output;
a multiplexer (MUX) having a first input, a second input, a select input, and a MUX output, wherein said output of said AND logic is coupled to said select input of said MUX;
wherein, said eFuse circuit includes a fuse coupled to a switch that is controlled by signals from a fuse latch, a pattern latch, and a program signal source, said pattern latch being programmed with a fuse blow status indicating whether or not said fuse is to be blown during device testing; and
means for connecting components and signals of said eFuse circuit to said MUX and said AND logic, wherein said MUX and said AND logic provide a bypass function that determines when a shifted "1" that is serially passed to each of said eFuse circuits should be forwarded to said fuse latch for initiating a blow of said fuse, wherein when a fuse blow status within said pattern latch indicates that said fuse is not to be blown, said MUX forwards said shifted 1 to a next eFuse circuit without forwarding said shifted 1 to said fuse latch; and
coupling means for connecting said input circuit to said serially connected eFuse circuit such that both a scan chain path and a shift chain path are supported within said device utilizing said scan only latches.

13. The device of claim 12, wherein:
a first input of said AND logic is coupled to a complement signal of said fuse blow status;
a second input of said AND logic is coupled to said program signal source;
said first input of said MUX is coupled to said fuse latch;
said second input of said MUX is coupled to a MUX output of a previous MUX; and
said MUX output of said MUX is connected to a second input of a next MUX.

14. The device of claim 13, wherein, said eFuse circuit is a first eFuse circuit and is serially connected to at least a second eFuse circuit whose fuse bow status indicates no blowing of its fuse and a third eFuse circuit whose fuse blow status indicates a blowing of its fuse, said circuit comprising:
means for routing said shifted 1 though said fuse latch of said first eFuse circuit, bypassing a fuse latch of said second eFuse circuit and routing said shifted 1 though a fuse latch of said third eFuse circuit, wherein only said first eFuse circuit and said second eFuse circuit utilizes processing time for routing said shifted 1 though respective fuse latches.

15. In a device that includes a single input, scan-only latch and a two-tiered NAND gate circuit configuration providing a resulting output to said single input latch, and a series of clock inputs, a system for reducing surface area required for supporting both scan chain and shift chain operations within the device, said system comprising:
means for receiving the resulting output at the input port of said latch, wherein said resulting output is one of a scan chain input or a shift chain input;
means for selectively accepting the scan chain input into said latch to commence a scan chain operation within said device only when a first clock input is on; and
means for alternatively accepting the shift chain input into said latch to commence a shift chain operation within said device only when a second, different clock input is on, wherein only one clock signal is on at a time and both said scan chain operation and said shift chain operation are supported by said single input, scan only latch.

16. The device of claim 15, wherein:
said means for accepting the scan chain input includes a first two-input NAND gate that receives as input a first clock signal along with a ScanIN input and yields a scan chain NAND output;
said means for accepting a shift chain input includes a second two-input NAND gate that receives as input a second clock signal along with a shiftIN input and yields a shift chain NAND output, wherein both said first and second NAND gates process their respective inputs during an input operation; and
said system further comprises a third NAND gate that receives as input said scan chain NAND output and said shift chain NAND output, wherein both outputs are subsequently NANDed to yield a two-tiered NAND result.

17. The device of claim 16, wherein said system further comprises a buffer that temporarily delays the two-tiered NAND result prior to sending said two-tiered NAND result to said latch as the input, wherein said two-tiered NAND result is delayed for a preset amount of time corresponding to a time a respective clock input is on.

18. A method for reducing surface area required for supporting both scan chain and shift chain operations within a device that includes a single input scan-only latch and a two-tiered NAND gate circuit configuration providing a resulting output to said single input latch, and a series of clock inputs, said method comprising:
receiving the resulting output at an input port of said latch, wherein said resulting output represents one of a scan chain input or a shift chain input;
accepting the scan chain input into said latch to commence a scan chain operation within said device only when a first clock input is on; and
accepting the shift chain input into said latch to commence a shift chain operation within said device only when a second, different clock input is on, wherein only one clock signal is on at a time and both said scan chain operation and said shift chain operation are supported by said single input, scan only latch.

19. The method of claim 18, further comprising:
NANDing a first clock input signal with a scanIN input in a first NANDing operation;
NANDing a second clock input signal with a shiftIN input in a second NANDing operation; and
subsequently NANDing a result of said first NANDing operation on said scanIN input and said second NANDing operation on said shiftIN input to yield a two-tiered NAND result.

20. The method of claim 19, further comprising buffering the two-tiered NAND result prior to sending said two-tiered NAND result to said latch as the inputs, wherein said NAND result is delayed for a preset amount of time corresponding to a time when a respective clock input is on.

* * * * *